(12) United States Patent
Nakanishi

(10) Patent No.: US 8,907,492 B2
(45) Date of Patent: Dec. 9, 2014

(54) SEMICONDUCTOR DEVICE

(71) Applicant: Panasonic Corporation, Osaka (JP)

(72) Inventor: Kazuyuki Nakanishi, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/665,170

(22) Filed: Oct. 31, 2012

(65) Prior Publication Data

US 2013/0056803 A1    Mar. 7, 2013

Related U.S. Application Data

(63) Continuation of application No. PCT/JP2011/001791, filed on Mar. 25, 2011.

(30) Foreign Application Priority Data

Oct. 21, 2010 (JP) ................................ 2010-236526

(51) Int. Cl.
| | | |
|---|---|---|
| *H01L 23/528* | (2006.01) | |
| *H01L 27/118* | (2006.01) | |
| *H01L 27/02* | (2006.01) | |

(52) U.S. Cl.
CPC ...... *H01L 27/11807* (2013.01); *H01L 27/0207* (2013.01); *H01L 23/5286* (2013.01); *H01L 2924/0002* (2013.01)
USPC .................... 257/774; 257/E23.001; 257/734

(58) Field of Classification Search
CPC ................................ H01L 21/76; H01L 23/52
USPC .......... 257/206, 288, 774, E23.011, E27.062, 257/E29.255
See application file for complete search history.

(56) References Cited

U.S. PATENT DOCUMENTS

| | | |
|---|---|---|
| 6,525,350 B1 | 2/2003 | Kinoshita et al. |
| 2010/0059794 A1* | 3/2010 | Shimizu et al. ............... 257/206 |
| 2010/0059826 A1 | 3/2010 | Shimizu |

FOREIGN PATENT DOCUMENTS

| | | |
|---|---|---|
| JP | 09-129740 A | 5/1997 |
| JP | 09-129740 A | 5/1997 |
| JP | 2009-141167 A | 6/2009 |
| JP | 2009-141167 A | 6/2009 |
| JP | 2010-067799 A | 3/2010 |
| JP | 2010-183015 A | 8/2010 |
| JP | 2010-183015 A | 8/2010 |

OTHER PUBLICATIONS

International Search Report issued in International Patent Application No. PCT/JP2011/001791 dated Jun. 28, 2011.
English translation of Chinese Search Report issued in Chinese Application No. 201180020923.8 dated Aug. 22, 2014.

* cited by examiner

*Primary Examiner* — Fernando L Toledo
*Assistant Examiner* — Lawrence-Linh T Nguyen
(74) *Attorney, Agent, or Firm* — McDermott Will & Emery LLP

(57) ABSTRACT

Power supply plugs, which couple a power supply active region to a power supply metal interconnect, include a plurality of first plugs, which are arranged at first pitches of a predetermined length, and a second plug, which is spaced apart from the closest one of the first plugs by a center-to-center distance different from an integral multiple of the predetermined length. Among the power supply plugs, the second plug is closest to a third plug, which is an interconnect plug closest to the power supply active region and the power supply metal interconnect.

8 Claims, 13 Drawing Sheets

SEMICONDUCTOR DEVICE

CROSS-REFERENCE TO RELATED APPLICATION

This is a continuation of PCT International Application PCT/JP2011/001791 filed on Mar. 25, 2011, which claims priority to Japanese Patent Application No. 2010-236526 filed on Oct. 21, 2010. The disclosures of these applications including the specifications, the drawings, and the claims are hereby incorporated by reference in their entirety.

BACKGROUND

The present disclosure relates to layout of semiconductor devices, and more particularly to techniques advantageous in miniaturization and higher speed operation of semiconductor devices.

Conventionally, semiconductor devices are implemented as various circuit units having desired functions by arranging and coupling transistors with various widths and lengths. The circuit units are called cells. A large-scale integration (LSI) is formed by combining, arranging, and coupling the cells.

In recent years, with reduction in the areas of the cells for reducing the costs of chips, not only reduction in the sizes of transistors and interconnects provided in each cell, but also arrangement of the transistors and the interconnects without wasting space have been required. This causes the following problems particularly in the layout of complicated cells such as flip-flop circuits and latch circuits.

FIG. 11 is a layout top view for forming a latch circuit cell with a small area. In FIG. 11, transistors Tn (hereinafter n is an integer) formed by gate interconnects Gn and active regions Dn forming source/drains are provided. Metal interconnects Mn for coupling the transistors Tn are formed above the transistors Tn. Power supply active regions DV0-DV1 and power supply metal interconnects MV0-MV1 for supplying source potential of the transistors Tn extend at the upper and lower end of the cell in the horizontal direction of the drawing. Also, the interconnect plugs Pn coupling the gate interconnects Gn or the active regions Dn to the metal interconnects Mn, and power supply plugs PVn for coupling the active regions DV0-DV1 to the metal interconnects MV0-MV1 are formed. In order to reduce source potential drop of the transistors Tn, the power supply plugs PVn are usually provided in plurality at equal intervals. The centers of the power supply plugs PVn are located on grid lines Ln at pitches S0 of a predetermined length. As a result, the power supply plugs of each cell can be arranged to overlap each other when a plurality of cells, of which width is defined by integral multiple of the pitch S0, are adjacent to each other from right to left or up and down, thereby densely arranging the power supply plugs without inferring each other.

Where the potential of the gate interconnects Gn is significantly different from the source potential of the transistors Tn, noise occurring in the power supply active regions DV0-DV1 or the power supply metal interconnects MV0-MV1 influences the gate interconnects Gn to cause a malfunction of the transistors. In order to reduce the problem, the distance between the interconnect plugs Pn and the power supply plugs PVn needs to be greater than the distance between the power supply plugs PVn. For example, in FIG. 11, the distance between an interconnect plug P14 and power supply plugs PV6 and PV7, the distance between an interconnect plug P24 and power supply plugs PV10 and PV11, the distance between an interconnect plug P15 and power supply plugs PV21 and PV22, and the distance between an interconnect plug P20 and power supply plugs PV23 and PV24 need to be great. Also, even where the potential of the gate interconnects Gn is not significantly different from the source potential of the transistors Tn, the distance between the interconnect plugs Pn and the power supply plugs PVn need to be great to some extent in view of a design rule and a manufacturing process. Then, however, each cell needs to extend in the vertical direction, resulting in an increase in the area of the cell.

As a measure of solving the problem, Japanese Patent Publication No. 2010-067799 teaches omitting part of power supply plugs PVn. For example, in FIG. 12, the power supply plugs PV6, PV7, PV10, PV11, and PV21-PV24 in FIG. 11 are omitted. As a result, the layout of a cell can be maintained small, while sufficiently increasing the distance between interconnect plugs Pn and the power supply plugs PVn, thereby stabilizing circuit operation. The power supply metal interconnects MV0-MV1 have lower resistance than power supply active regions DV0-DV1. Thus, substantial source potential drop occurs in a power supply active region from a transistor and a closest power supply plug. If the power supply active region is short, in other words, if the transistor is close to the power supply plug, the source potential drop is not so problematic. For example, since a power supply plug PV9 is provided, reduction in the source potential of transistors T12 and T14 are not problematic.

SUMMARY

However, where the technique of Japanese Patent Publication No. 2010-067799 is applied to a semiconductor device formed by arranging cells adjacent to each other in the vertical direction, too many power supply plugs are omitted, thereby significantly reducing the source potential of the transistors.

FIG. 13 illustrates an example where the technique of Japanese Patent Publication No. 2010-067799 is applied to a semiconductor device formed by arranging cells like FIG. 11 adjacent to each other in the vertical direction. In FIG. 13, all of power supply plugs PV6-PV13 are omitted on the grid lines L6-L13 of a power supply active region DV0 and a power supply metal interconnect MV0. As a result, indeed, the distance between the interconnect plugs Pn and the power supply plugs PVn can be obtained large, and operation stability of semiconductor device can be maintained. However, the source potential of some transistors largely decreases since the power supply plugs are distant. For example, when transistors T12 and T14 are focused on, the closest power supply plugs are PV5 and PV14, which are distant from the transistors, thereby largely reducing the source potential. This degrades current drive capabilities of the transistors and reduces the operation speed of the semiconductor device.

In a recent semiconductor device, a single standard cell may be formed by using two adjacent standard cell rows. In this structure, gate interconnects or active regions often cross power supply metal interconnects arranged between the standard cell rows. In this case, where the gate interconnects or the active regions, which cross the power supply metal interconnects, are too close to the power supply plugs, the possibility of causing formation problems such as shorting of the gate interconnects or the active regions, and the power supply plugs increases. Omitting power supply plugs on the grid lines, which are close to the gate interconnects or the active regions crossing the power supply metal interconnects, is considered as a measure. It is, however, not preferable, since the source potential of the transistors decreases, as described above.

It is an objective of the present disclosure to provide a layout structure of a semiconductor device sufficiently securing the distance between interconnect plugs and power supply plugs to maintain operation stability without causing reduction in the operation speed or an increase in the area due to degradation in the current drive capabilities of the transistors.

It is also an objective of the present disclosure to provide a layout structure of a semiconductor device sufficiently obtaining the distance between power supply plugs, and gate interconnects and active regions, which cross power supply metal interconnects, to maintain operation stability without causing reduction in the operation speed or an increase in the area due to degradation in the current drive capabilities of the transistors.

According to a first aspect of the present disclosure, a semiconductor device includes a power supply active region extending in a first direction; an active region located at one side of the power supply active region in a second direction perpendicular to the first direction and serving as a source or a drain of a transistor; a gate interconnect located at the side of the power supply active region, at which the active region is located, in the second direction, and serving as a gate of the transistor; a power supply metal interconnect located above the power supply active region; a circuit metal interconnect located above the active region and the gate interconnect; a plurality of power supply plugs coupling the power supply active region to the power supply metal interconnect; and a plurality of interconnect plugs coupling the active region or the gate interconnect to the circuit metal interconnect. The plurality of power supply plugs include a plurality of first plugs arranged at first pitches of a predetermined length, and a second plug spaced apart from closest one of the first plugs by a center-to-center distance which is different from an integral multiple of the predetermined length. The plurality of interconnect plugs include a third plug closest to the power supply active region and the power supply metal interconnect. Among the power supply plugs, the second plug is closest to the third plug.

In this aspect, the plurality of power supply plugs, which couple the power supply active region to the power supply metal interconnect, includes the plurality of plugs (the first plugs), which are arranged at the pitches of the predetermined length, and the plug (the second plug), which is spaced apart from the closest one of the first plugs by the center-to-center distance which is different from the integral multiple of the predetermined length, i.e., which are arranged at shifted pitches. As viewed from the interconnect plug (third plug) closest to the power supply active region and the power supply metal interconnect, the closest power supply plug is not one of the first plugs arranged at the pitches of predetermined length, but the second plug arranged at the shifted pitch. That is, in a portion close to the interconnect plug, the power supply plugs are not omitted but arranged at shifted pitches, i.e., in shifted positions in the first direction to which the power supply active region extends. As a result, the distance between the interconnect plug and the power supply plugs can be sufficiently obtained without causing reduction in the source potential of the transistor. In addition, there is no need to extend the semiconductor device in the second direction perpendicular to the first direction.

According to a second aspect of the present disclosure, a semiconductor device includes a power supply active region extending in a first direction; an active region located at one side of the power supply active region in a second direction perpendicular to the first direction and serving as a source or a drain of a transistor; a gate interconnect located at the side of the power supply active region, at which the active region is located, in the second direction, and serving as a gate of the transistor; a power supply metal interconnect located above the power supply active region; a circuit metal interconnect located above the active region and the gate interconnect; a plurality of power supply plugs coupling the power supply active region to the power supply metal interconnect; and a plurality of interconnect plugs coupling the active region or the gate interconnect to the circuit metal interconnect. The plurality of power supply plugs include a plurality of first plugs arranged in a line in the first direction, and a second plug located in a position shifted to be more distant from the plurality of first plugs as viewed from the active region and the gate interconnect. The plurality of interconnect plugs include a third plug closest to the power supply active region and the power supply metal interconnect. Among the power supply plugs, the second plug is closest to the third plug.

In this aspect, the plurality of power supply plugs, which couple the power supply active region to the power supply metal interconnect, include the plurality of plugs (the first plugs), which are arranged in a line in the first direction, in which the power supply active region extends, and the plug (the second plug), which is located in the position shifted to be more distant from the plurality of first plugs as viewed from the active region and the gate interconnect. As viewed from the interconnect plug (the third plug) closest to the power supply active region and the power supply metal interconnect, the closest power supply plug is not one of the first plugs arranged in a line, but the second plug shifted to the distant position. That is, in a portion close to the interconnect plug, the power supply plugs are not omitted but shifted to distant positions. As a result, the distance between the interconnect plug and the power supply plugs can be sufficiently obtained without causing reduction in the source potential of the transistor. In addition, where there is a vacant region at the side to which the power supply plugs are shifted, there is no need to extend the semiconductor device in the second direction perpendicular to the first direction in which the power supply active region extends.

According to a third aspect of the present disclosure, a semiconductor device includes a power supply metal interconnect extending in a first direction; a gate interconnect located under the power supply metal interconnect, and extending to cross the power supply metal interconnect from side to side in a second direction perpendicular to the first direction; a power supply active region located under the power supply metal interconnect at at least one side of the gate interconnect in the first direction; and a plurality of power supply plugs coupling the power supply active region to the power supply metal interconnect. The plurality of power supply plugs include a plurality of first plugs arranged at first pitches of a predetermined length, and a second plug spaced apart from closest one of the first plugs by a center-to-center distance which is different from an integral multiple of the predetermined length. Among the power supply plugs, the second plug is closest to the gate interconnect.

In this aspect, the plurality of power supply plugs, which couple the power supply active region to the power supply metal interconnect, include the plurality plugs (the first plugs), which are arranged at first pitches of the predetermined length, and the plug (the second plug), which is spaced apart from closest one of the first plugs by the center-to-center distance which is different from the integral multiple of the predetermined length, i.e., arranged at a shifted pitch. As viewed from the gate interconnect extending to cross the power supply metal interconnect, the closest power supply plug is not one of the first plugs arranged at the pitches of the predetermined length, but the second plug located at the shifted pitch. That is, in a portion close to the gate interconnect crossing the power supply metal interconnect, the power supply plugs are not omitted but shifted, i.e., arranged in shifted positions in the first direction to which the power supply metal interconnect extends. As a result, the distance between the gate interconnect extending to cross the power supply metal interconnect and the power supply plugs can be sufficiently obtained without causing reduction in the source potential of the transistor.

According to a fourth aspect of the present disclosure, a semiconductor device includes a power supply metal interconnect extending in a first direction; an active region located under the power supply metal interconnect, formed to cross the power supply metal interconnect from side to side in a second direction perpendicular to the first direction, and receiving potential different from power supply potential supplied by the power supply metal interconnect; a power supply active region located under the power supply metal interconnect at at least one side of the active region in the first direction; and a plurality of power supply plugs coupling the power supply active region to the power supply metal interconnect. The plurality of power supply plugs include a plurality of first plugs arranged at first pitches of a predetermined length, and a second plug spaced apart from closest one of the first plugs by a center-to-center distance which is different from an integral multiple of the predetermined length. Among the power supply plugs, the second plug is closest to the active region.

In this aspect, the plurality of power supply plugs, which couple the power supply active region to the power supply metal interconnect, include the plurality of plugs (the first plugs) arranged at the pitches of the predetermined length, and the plug (the second plug), which is spaced apart from the closest one of the first plugs by the center-to-center distance which is different from the integral multiple of the predetermined length, i.e., which are arranged at a shifted pitch. As viewed from the active region extending to cross the power supply metal interconnect, the closest power supply plug is not one of the first plugs arranged at the pitches of the predetermined length, but the second plug located at the shifted pitch. That is, in a portion close to active region crossing the power supply metal interconnect, the power supply plugs are not omitted but arranged at shifted pitches, i.e., in shifted positions in the first direction to which the power supply metal interconnect extends. As a result, the distance between the active region extending to cross the power supply metal interconnect and the power supply plugs can be sufficiently obtained without causing reduction in the source potential of the transistor.

In the present disclosure, the power supply plugs are arranged in shifted positions in the portions of the power supply active region and the power supply metal interconnect close to the interconnect plugs. As a result, the distance between the interconnect plugs and the power supply plugs can be sufficiently obtained with a small area to maintain operation stability, while reducing the source potential drop of the transistors. This mitigates reduction in the operation speed caused by degradation in the current drive capabilities of the transistors.

In the present disclosure, the power supply plugs are arranged in shifted positions in the portions close to the gate interconnect and the active region, which cross the power supply metal interconnect. As a result, the distance between the power supply plugs and the gate interconnect and the active region, which cross the power supply metal interconnect, can be sufficiently obtained with a small area to maintain operation stability, while reducing the source potential drop of the transistors. This mitigates reduction in the operation speed caused by degradation in the current drive capabilities of the transistors.

DETAILED DESCRIPTION

Embodiments will be described hereinafter with reference to the drawings.

First Embodiment

Figure 1:
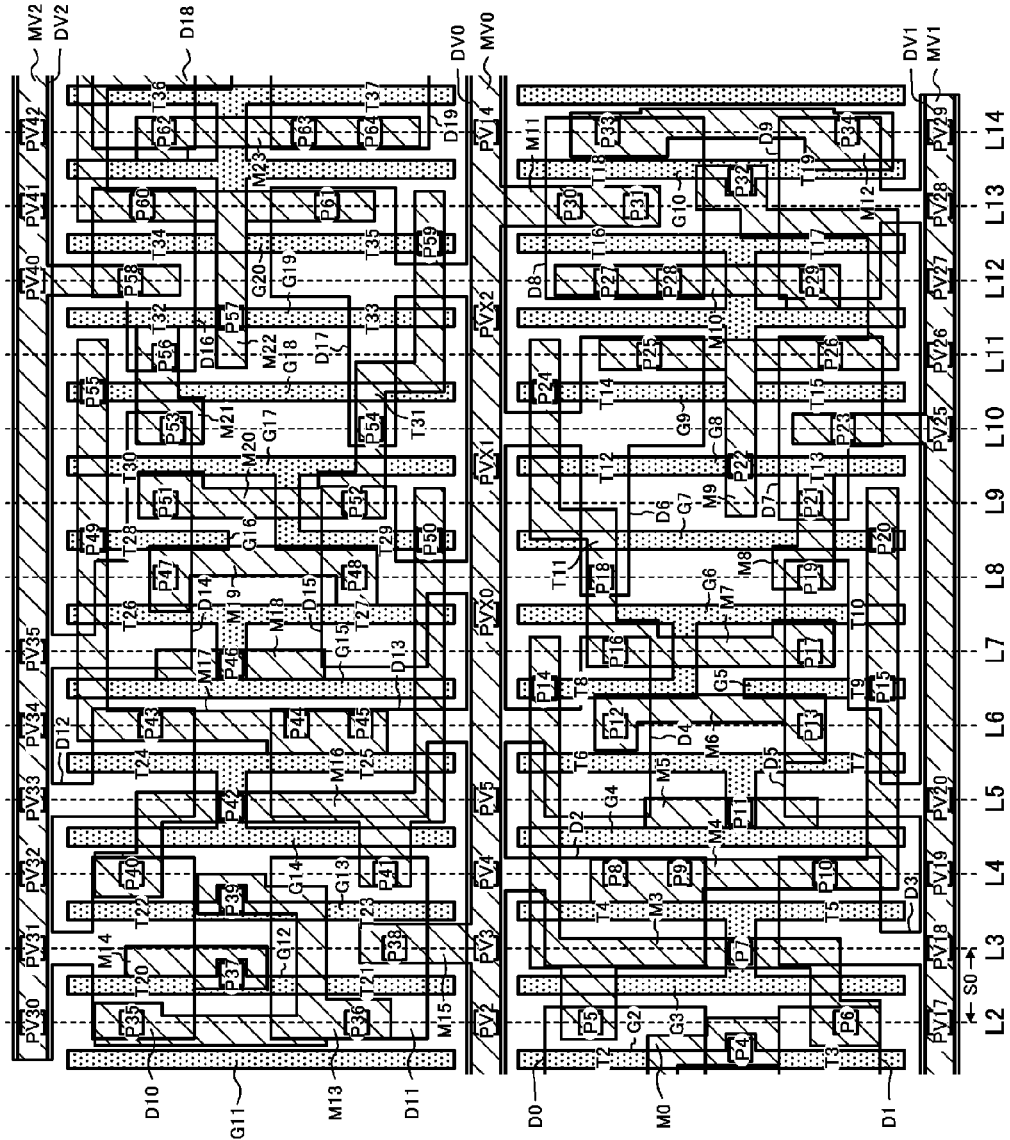
FIG. 1 illustrates an example layout pattern of a semiconductor device according to a first embodiment.
Figure 2:
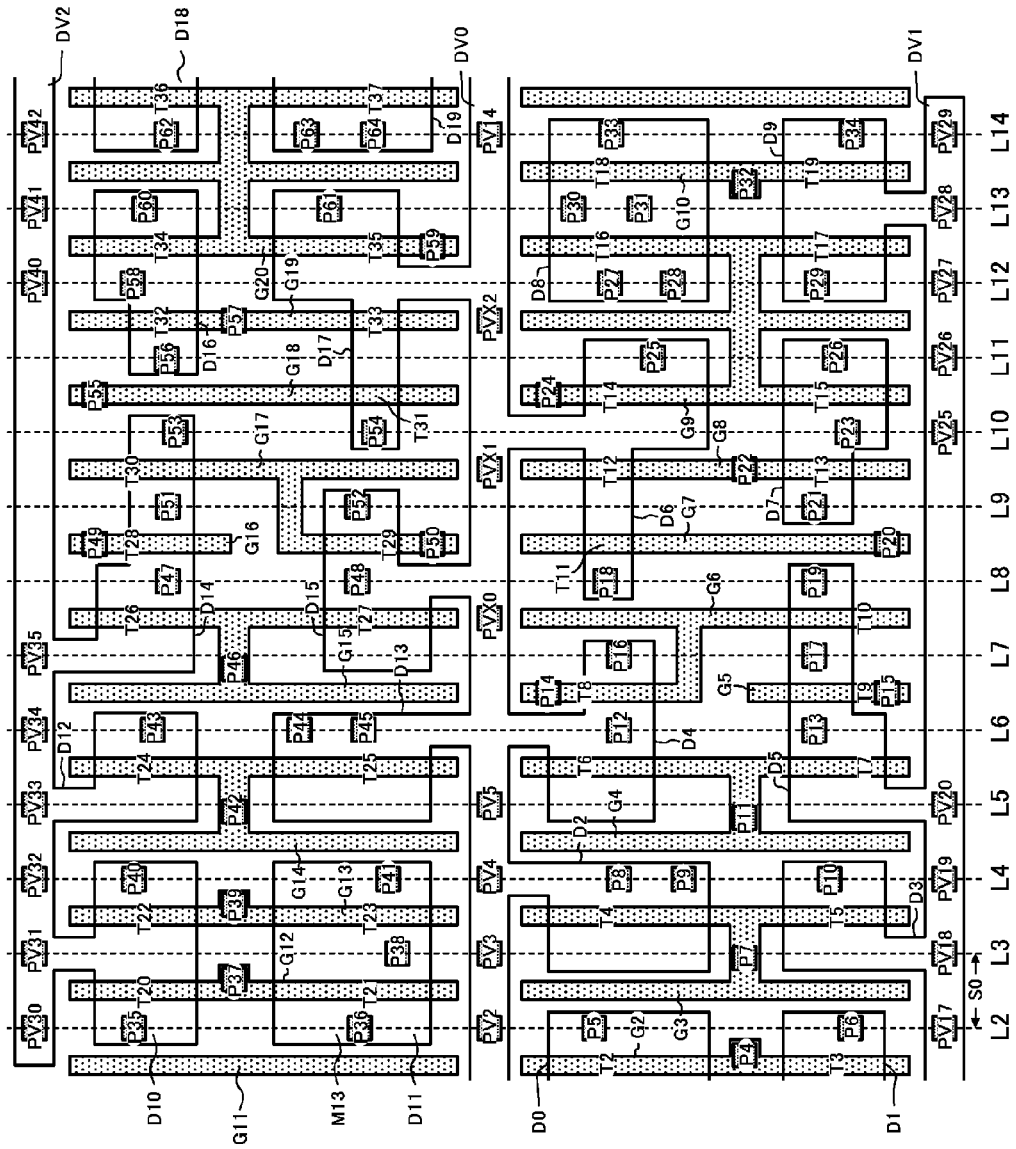
FIG. 2 illustrates the semiconductor device of FIG. 1 from which metal interconnects are omitted.
Figure 3:
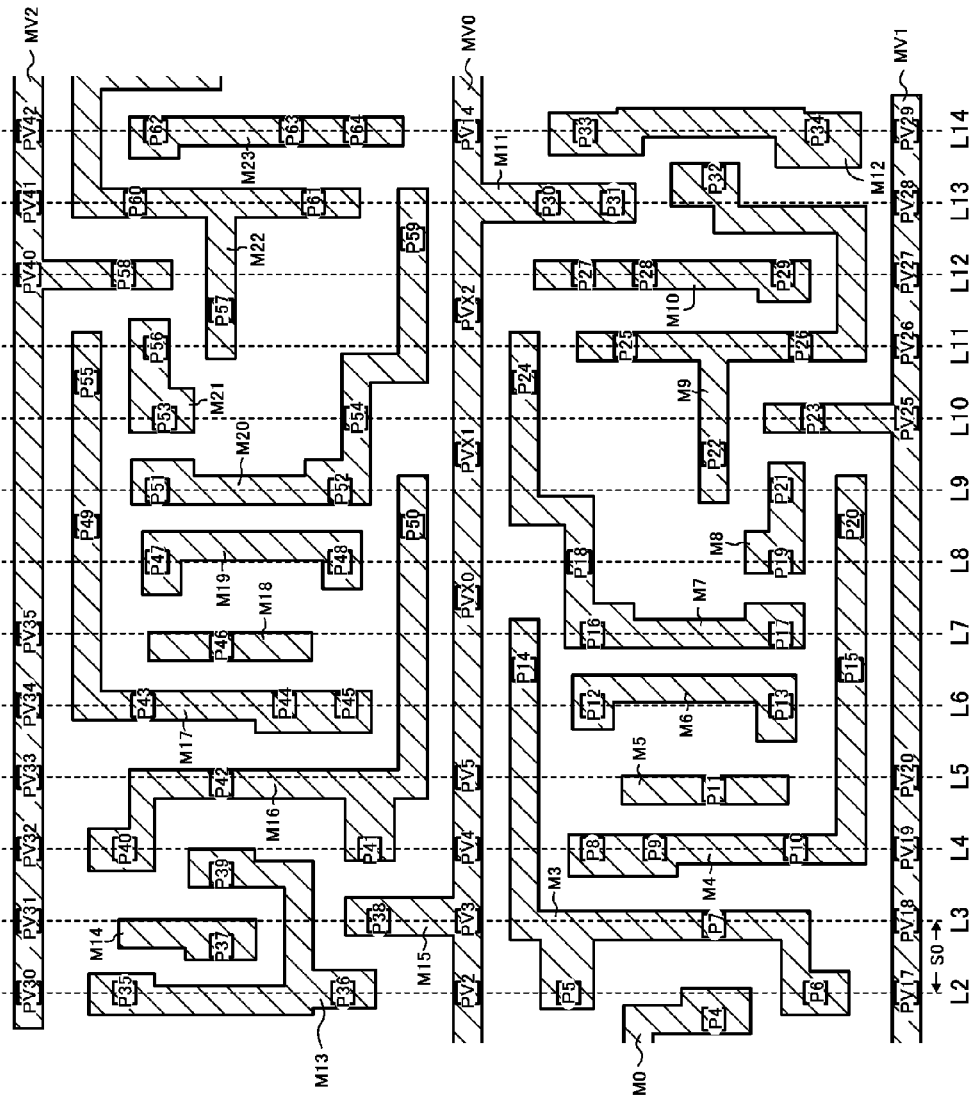
FIG. 3 illustrates the semiconductor device of FIG. 1 from which active regions and gate interconnects are omitted.

FIG. 1 is a top view illustrating an example layout pattern of a semiconductor device according to a first embodiment. FIG. 1 illustrates an area around the boundary of two adjacent standard cells as a major portion of the semiconductor device. FIG. 1 illustrates active regions and gate interconnects forming transistors such as MISFETs, metal interconnects provided thereabove, and plugs electrically coupling the active regions to the metal interconnects. FIGS. 2 and 3 are simplified views of FIG. 1. In FIG. 2, the metal interconnects are omitted from FIG. 1 and only the gate interconnects, the active regions, and the plugs are shown. In FIG. 3, the active regions and the gate interconnects are omitted from FIG. 1 and only the metal interconnects and the plugs are shown.

In FIG. 1, DV0-DV2 denote power supply active regions for supplying source potential of the transistors, and extending in the horizontal direction (a first direction) of the drawing at the upper and lower ends of a cell. Power supply metal interconnects MV0-MV2 are provided above the power supply active regions DV0-DV2, respectively. The power supply active region DV0 is electrically coupled to the power supply metal interconnect MV0 by a plurality of power supply plugs PV2-PV5, PV14, and PVX0-PVX2, which are formed therebetween. Similarly, the power supply active region DV1 is electrically coupled to the power supply metal interconnect MV1 by a plurality of power supply plugs PV17-PV20 and PV25-PV29, which are formed therebetween. The power supply active region DV2 is electrically coupled to the power supply metal interconnect MV2 by a plurality of power supply plugs PV30-PV35 and PV40-PV42, which are formed therebetween.

Active regions D0-D9, which serve as sources or drains of transistors, and gate interconnects G2-G10, which serve as gates of the transistors, are provided between power supply active regions DV0 and DV1, thereby forming transistors T2-T19. Similarly, active regions D10-D19, which serve as sources or drains of transistors, and gate interconnects G11-G20, which serve as gates of the transistors, are provided between the power supply active regions DV0 and DV2, thereby forming transistors T20-T37. The active regions are defined by forming a shallow isolation called a shallow trench isolation (STI) or a shallow groove isolation (SGI), on a principal surface of a semiconductor substrate. The gate interconnects are made of, for example, a polycrystalline silicon film, and are patterned on the principal surface of the semiconductor substrate with a gate insulating film, which is a thin silicon oxide film, etc., interposed therebetween.

Circuit metal interconnects M0-M12 are provided between the power supply active regions DV0 and DV1, and above the active regions D0-D9 and the gate interconnects G2-G10. A plurality of interconnect plugs P4-P34 are provided to electrically couple the active regions D0-D9 and the gate interconnects G2-G10 to the circuit metal interconnects M0-M12. Similarly, circuit metal interconnects M13-M23 are provided between the power supply active regions DV0 and DV2 above the active regions D10-D19 and the gate interconnects G11-G20. A plurality of interconnect plugs P35-P64 are provided to electrically couple the active regions D10-D19 and the gate interconnects G11-G20 to the circuit metal interconnects M13-M23. A function of a circuit such as a flip-flop circuit and a latch circuit is implemented by the active regions and the gate interconnects, which are electrically coupled by the circuit metal interconnects.

Power supply plugs electrically coupling power supply active regions to power supply metal interconnects are usually arranged in a plural number and at pitches of a predetermined length to reduce the source potential drop of the transistors. In FIG. 1, basically, power supply plugs PVn, where n is an integer, are arranged on grid lines L2-L14, which are spaced apart from each other at constant distances S0. In order to avoid the influence of noise occurring in the power supply active regions or the power supply metal interconnects on gate interconnects, some power supply plugs are omitted on the grid lines, similar to Japanese Patent Publication No. 2010-067799. For example, power supply plugs are omitted on the grid lines L6-L13 in the power supply active region DV0 and the power supply metal interconnect MV0. This aims to sufficiently obtain the distance between interconnect plugs P14, P24, P50, and P59, and power supply plugs, thereby maintaining the operation stability of the transistors.

However, where the power supply plugs are simply omitted on the grid lines L6-L13, for example, the power supply plugs closest to the transistors T12 and T14 are PV5 and PV14, which are distant from the transistors. As described in the Summary, if power supply plugs are distant from transistors, the source potential of the transistors largely decreases. This degrades the current drive capabilities of the transistors, and reduces the operation speed of the semiconductor device.

Thus, in this embodiment, in the range on the grid lines L6-L13, where power supply plugs are omitted, power supply plugs PVX0-PVX2 are provided in positions sufficiently apart from the interconnect plugs P14, P24, P50, and P59 between the grid lines. As a result, for example, the power supply plug closest to the transistor T12 is PVX1, which is very close to the transistor, thereby mitigating reduction in the source potential. In an actual semiconductor device, for example, the distance from the center of each interconnect plug to the closest power supply plug is preferably greater than 2.5 times the diameter of the interconnect plug.

That is, in this embodiment, the power supply plugs, which couple the power supply active region DV0 to the power supply metal interconnect MV0, include the plurality of first plugs PV2-PV5, which are arranged at first pitches S0 of a predetermined length, and the second plugs PVX0-PVX2, which are spaced apart from the closest first plug PV5 by a center-to-center distance different from the integral multiple of the predetermined length. When the region at the upper side of the power supply active region DV0 and the power supply metal interconnect MV0 is focused on, the interconnect plugs closest to the power supply active region DV0 and the power supply metal interconnect MV0 are the third plugs P50 and P59. The power supply plug closest to the third plug P50 is the second plug PVX0 (or PVX1), and the power supply plug closest to the third plug P59 is the second plug PVX2. In other words, as viewed from the third plug, which is the interconnect plug closest to the power supply active region DV0 and the power supply metal interconnect MV0; the power supply plugs on the closest grid lines are omitted, and the second plug arranged between the grid lines is the closest power supply plug. That is, power supply plugs are not omitted near the interconnect plugs, but are arranged at shifted pitches, in other words, in shifted positions in the direction in which the power supply active regions extend. This mitigates reduction in the source potential of the transistors while reducing the influence of noise occurring in the power supply active regions or the power supply metal interconnects on the gate interconnects. In addition, there is no need to extend the semiconductor device in the vertical direction of the drawing, and the area is thus not increased.

While in FIG. 1, the power supply plug closest to the third plugs P50 and P59 are both the second plugs, the power supply plug closest to at least one of the third plugs may be the second plug.

As viewed from the second plug of the power supply plugs, the closest interconnect plug is the third plug. For example, the interconnect plug closest to the second plug PVX0 is the third plug P50. The interconnect plug closest to the second plug PVX2 is the third plug P59. The interconnect plug closest to at least one of the second plugs may be the third plug.

In FIG. 1, a center-to-center distance between the second plugs PVX0-PVX2 is the integral multiple (twice in FIG. 1) of the first pitch S0. This is because the second plugs PVX0-PVX2 are arranged almost in the center between the grid lines. Note that, the positions of the second plugs PVX0-PVX2 are not limited to the center between the grid lines.

Figure 4:
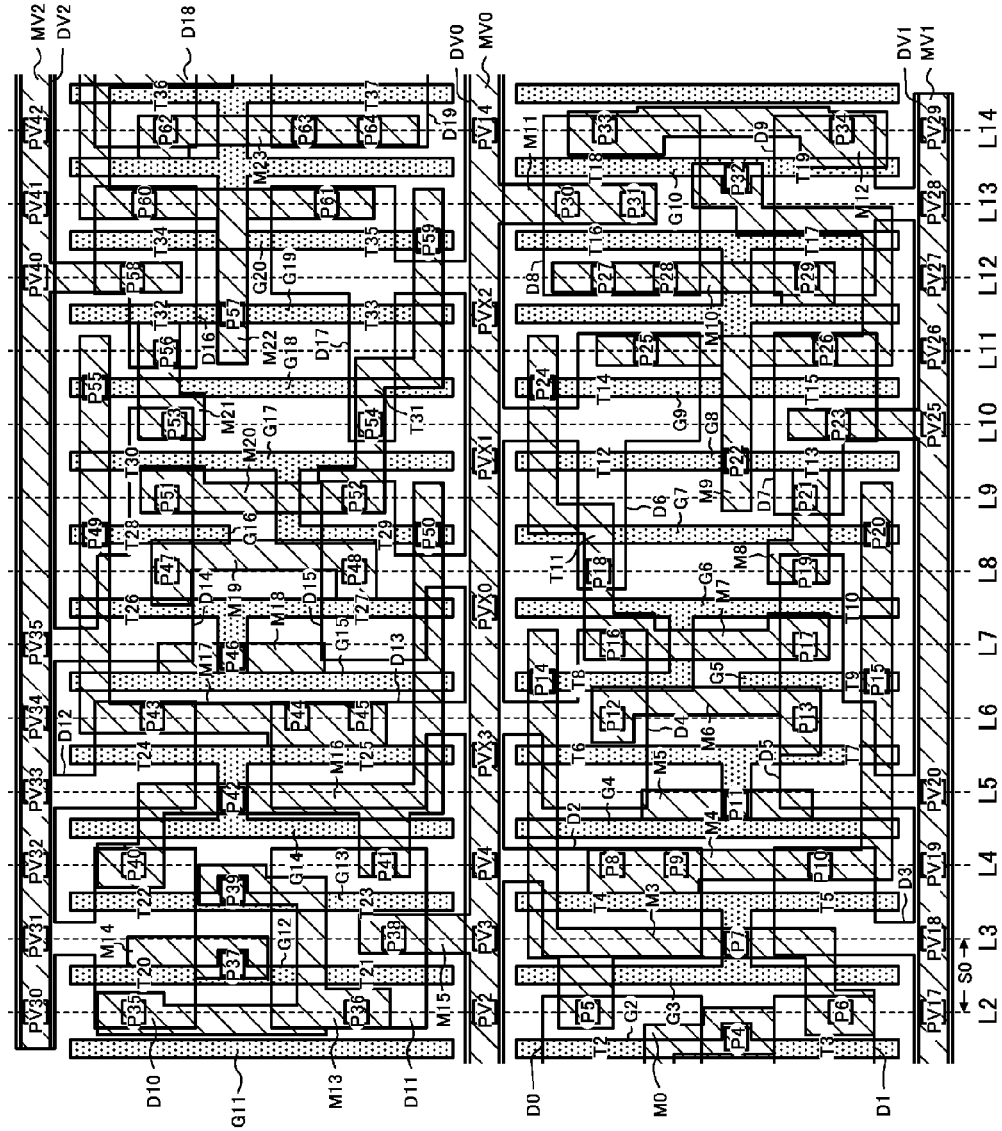
FIG. 4 illustrates another example layout pattern of the semiconductor device according to the first embodiment.

FIG. 4 is a top view illustrating another example layout pattern of the semiconductor device according to the first embodiment. Similar to FIG. 1, FIG. 4 illustrates an area around the boundary of two adjacent standard cells as a major portion of the semiconductor device. FIG. 4 illustrates active regions and gate interconnects forming transistors, metal interconnects provided thereabove, and plugs electrically coupling the active regions to the metal interconnects.

Different from FIG. 1, in FIG. 4, out of the power supply plugs coupling the power supply active region DV0 and the power supply metal interconnect MV0, a power supply plug PV5 is omitted on a grid line L5. Instead, a power supply plug PVX3 is provided between the grid lines L5 and L6. That is, in FIG. 4, the power supply plugs, which couple the power supply active region DV0 to the power supply metal interconnect MV0, include a plurality of first plugs PV2-PV4, which are arranged at first pitches S0 of a predetermined length, and the second plugs PVX0-PVX3, which are spaced apart from the closest first plug PV4 by a center-to-center distance different from the integral multiple of the predetermined length.

That is, similar to FIG. 1, in FIG. 4, as viewed from the third plug, which is the interconnect plug closest to the power supply active region DV0 and the power supply metal interconnect MV0, the power supply plug is omitted on the closest grid line. Instead, the second plug provided between the grid lines is the closest power supply plug. This mitigates reduction in the source potential of the transistors while reducing the influence of noise occurring in the power supply active regions or the power supply metal interconnects on the gate interconnects.

As viewed from, for example, transistors T6, T8, and T25, by omitting the first plug PV5 and providing the second plug PVX3, the power supply plug is close to the transistors. Therefore, the reduction in the source potential of the transistors T6, T8, and T25 is further mitigated, as compared to the structure in FIG. 1.

Figure 5:
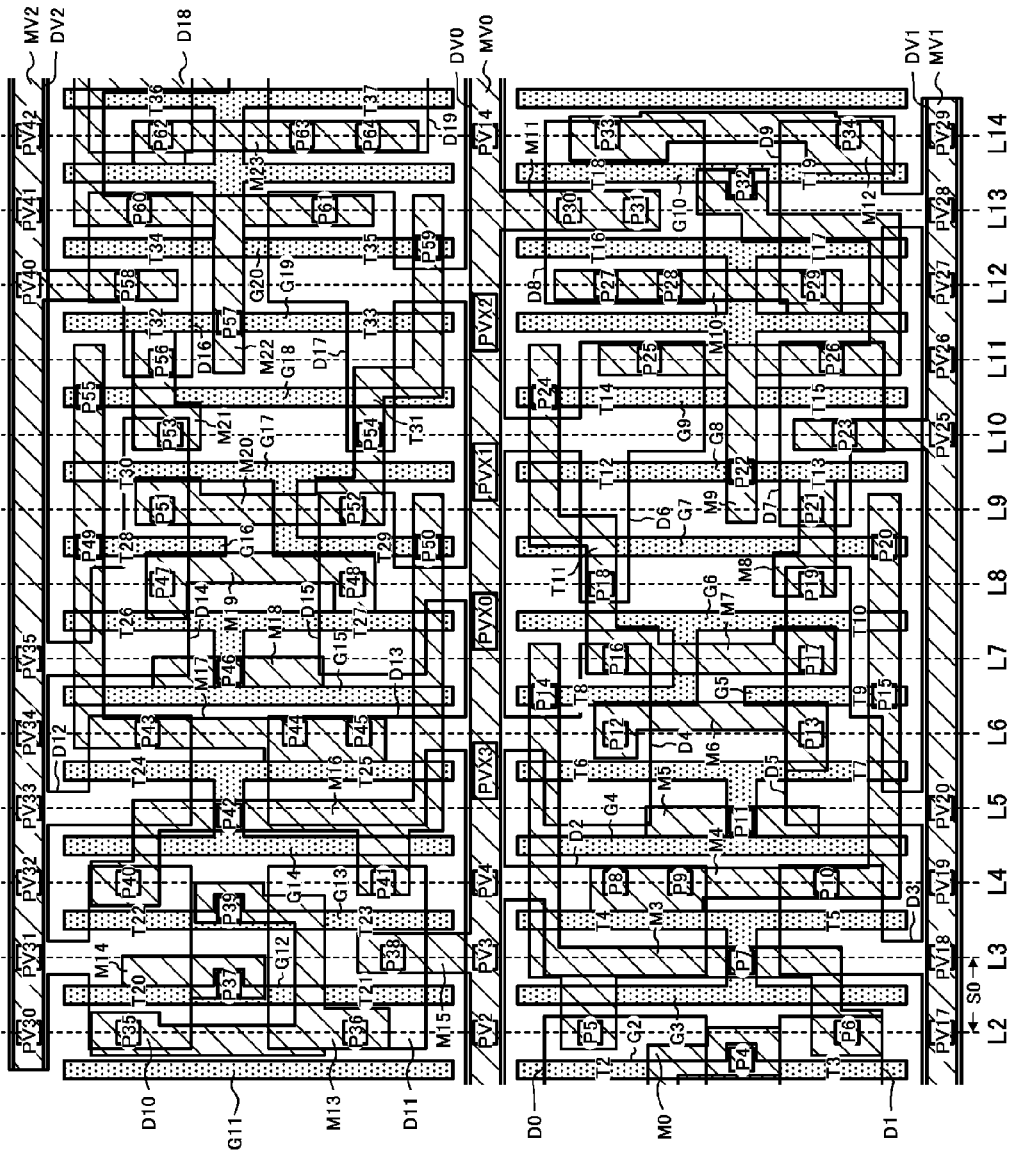
FIG. 5 illustrates still another example layout pattern of the semiconductor device according to the first embodiment.

FIG. 5 is a top view illustrating another example layout pattern of the semiconductor device according to the first embodiment. Similar to FIGS. 1 and 4, FIG. 5 illustrates an area around the boundary of two adjacent standard cells as a major portion of the semiconductor device. FIG. 5 illustrates active regions and gate interconnects forming transistors, metal interconnects provided thereabove, and plugs electrically coupling the active regions to the metal interconnects.

Different from FIG. 4, in FIG. 5, out of the power supply plugs coupling the power supply active region DV0 and the power supply metal interconnect MV0, the second plugs PVX0-PVX2 have a rectangular shape as viewed in plan. This further mitigates the reduction in the source potential of the transistors as compared to the structure in FIG. 4. The rectangular shape of the second plugs PVX0-PVX2 preferably has a maximum size as long as no influence of noise occurs. For example, the aspect ratio is 1:2.

In an actual manufacturing process, the corners of the rectangle of the second plugs PVX0-PVX2 may be rounded to form an oval shape.

Second Embodiment

Figure 6:
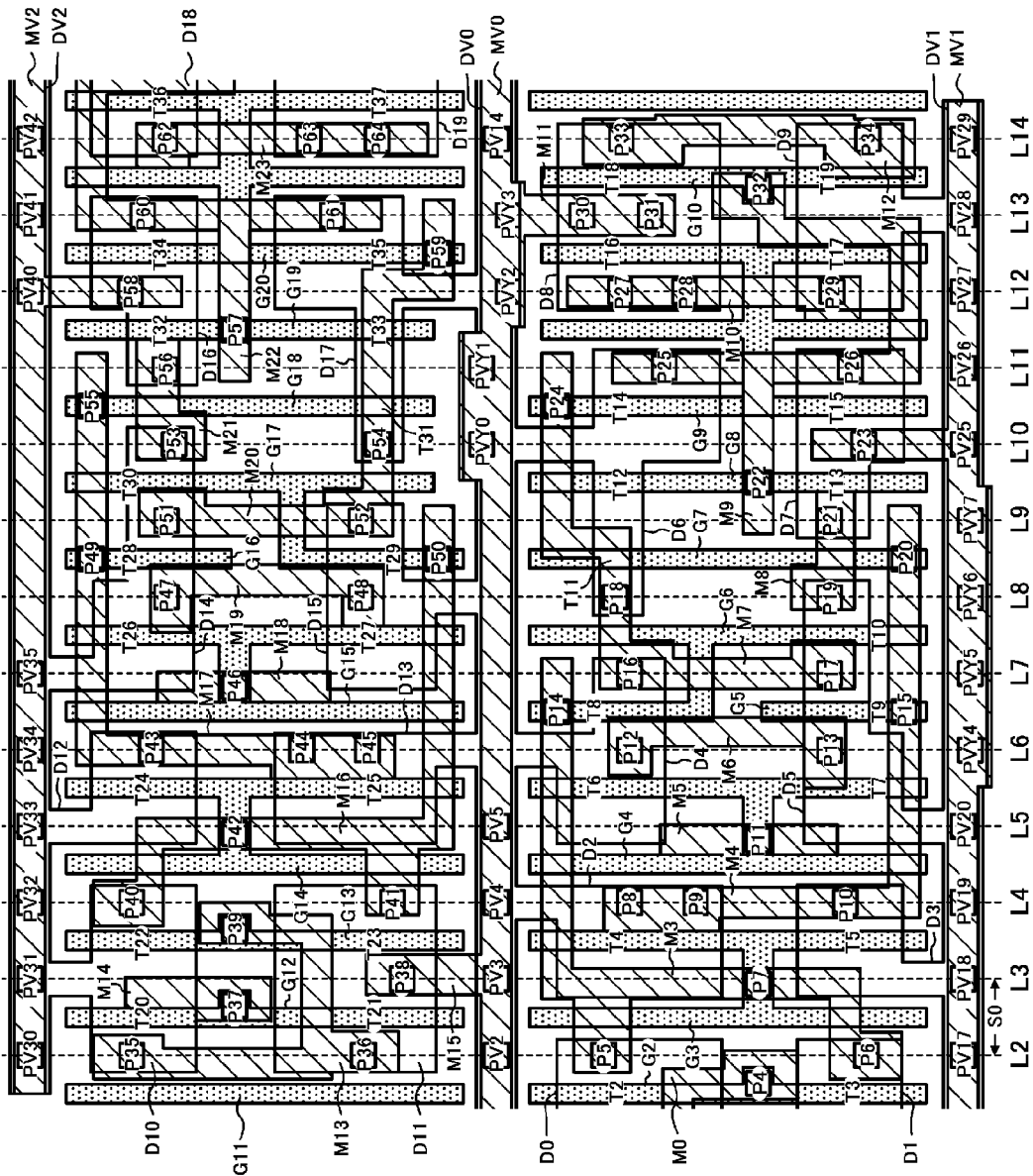
FIG. 6 illustrates an example layout pattern of a semiconductor device according to a second embodiment.

FIG. 6 is a top view illustrating an example layout pattern of a semiconductor device according to a second embodiment. Similar to FIG. 1, FIG. 6 illustrates an area around the boundary of two adjacent standard cells as a major portion of the semiconductor device. FIG. 6 illustrates active regions and gate interconnects forming transistors such as MISFETs, metal interconnects provided thereabove, and plugs electrically coupling the active regions to the metal interconnects. The same reference characters as those shown in FIG. 1 are used to represent equivalent elements, and the explanation thereof will be omitted.

In FIG. 6, power supply active regions DV0-DV1 and power supply metal interconnects MV0 and MV1 have a different shape as viewed in plan, and power supply plugs are located in different positions from FIG. 1. In FIG. 6, power supply plugs PVn are basically arranged on grid lines L2-L14, which are spaced apart from each other at constant distances S0. In order to avoid the influence of noise occurring in the power supply active regions or the power supply metal interconnects on gate interconnects, some power supply plugs are omitted on the grid lines, similar to Japanese Patent Publication No. 2010-067799. Besides, some power supply plugs are arranged in positions shifted to be more distant from interconnect plugs.

For example, power supply plugs are omitted on the grid lines L6-L13 in the power supply active region DV0 and the power supply metal interconnect MV0. On the grid lines L10 and L11, power supply plugs PVY0 and PVY1 are arranged in positions shifted to be more distant from an interconnect plug P24. On the grid lines L12 and L13, power supply plugs PVY2 and PVY3 are arranged in positions shifted to be more distant from an interconnect plug P59. On the grid lines L6-L9 in the power supply active region DV1 and the power supply metal interconnect MV1, power supply plugs PVY4-PVY7 are arranged in positions shifted to be more distant from interconnect plugs P15 and P20. The widths of the power supply active regions DV0-DV1 and the power supply metal interconnects MV0 and MV1 are greater in the portion provided with the shifted power supply plugs PVY0-PVY7 than in the portion provided with the rest of the power supply plugs PVn. For example, the power supply active region DV1 and the power supply metal interconnect MV1 expand to the outside of the cell in the portion provided with the power supply plugs PVY4-PVY7.

As described in the first embodiment, where the power supply plugs are simply omitted on the grid lines L6-L13, for example, the power supply plugs closest to the transistors T12 and T14 are PV5 and PV14, which are distant from the transistors. As described in the Summary, if power supply plugs are distant from transistors, the source potential of the transistors largely decreases. This degrades the current drive capabilities of the transistors, and reduces the operation speed of the semiconductor device.

Thus, in this embodiment, in the range on the grid lines L6-L13, where power supply plugs are omitted, power supply plugs PVY0-PVY3 are provided on the grid lines L10-L13 in positions shifted to be more distant from the interconnect plugs P24 and P59. As a result, for example, the power supply plug closest to the transistor T12 is PVY0, which is very close to the transistor, thereby mitigating reduction in the source potential. In an actual semiconductor device, for example, the distance from the center of each interconnect plug to the closest power supply plug is preferably greater than 2.5 times the diameter of the interconnect plug.

That is, in this embodiment, the power supply plugs, which couple the power supply active region DV0 to the power supply metal interconnect MV0, include the plurality of first plugs PV2-PV5, which are arranged in a line in the horizontal direction (a first direction) of the drawing, and the second plugs PVY0-PVY3, which are arranged in positions shifted from the first plugs PV2-PV5 in the vertical direction (a second direction) of the drawing. When the region at the upper side of the power supply active region DV0 and the power supply metal interconnect MV0 is focused on, the interconnect plugs closest to the power supply active region DV0 and the power supply metal interconnect MV0 are the third plugs P50 and P59. The power supply plugs closest to the third plug P59 are the second plugs PVY2 and PVY3, which are arranged in positions shifted to be more distant from the active region and the gate interconnects in the upper region. When the region at the lower side of the power supply active region DV0 and the power supply metal interconnect MV0 is focused on, the interconnect plugs closest to the power supply active region DV0 and the power supply metal interconnect MV0 are third plugs P14 and P24. The power supply plugs closest to the third plug P24 are the second plugs PVY0 and PVY1, which are arranged in positions shifted to be more distant from the active region and the gate interconnects in the lower region.

In other words, as viewed from the third plug, which is the interconnect plug closest to the power supply active region DV0 and the power supply metal interconnect MV0, the power supply plug on the closest grid line is arranged in a position shifted to be more distant. As a result, a sufficient number of power supply plugs can be sufficiently spaced apart from the interconnect plugs. This mitigates reduction in the source potential of the transistors while reducing the influence of noise occurring in the power supply active regions or the power supply metal interconnects on the gate interconnects. In addition, where there is a vacant region at the side to which the power supply plugs are shifted or the power supply plugs are shifted to the region outside the cell, there is no need to extend the semiconductor device in the vertical direction of the drawing, and the area is thus not increased.

As viewed from the second plug of the power supply plugs, the closest interconnect plug is the third plug. For example, the interconnect plug in the lower region closest to the second plugs PVY0 and PVY1, which are shifted to the upper side, is the third plug P24. The interconnect plug in the upper region closest to the second plugs PVY2 and PVY3, which are shifted to the lower side, is the third plug P59. At least one of the second plugs may be closet to the third plug among the interconnect plugs.

Figure 7:
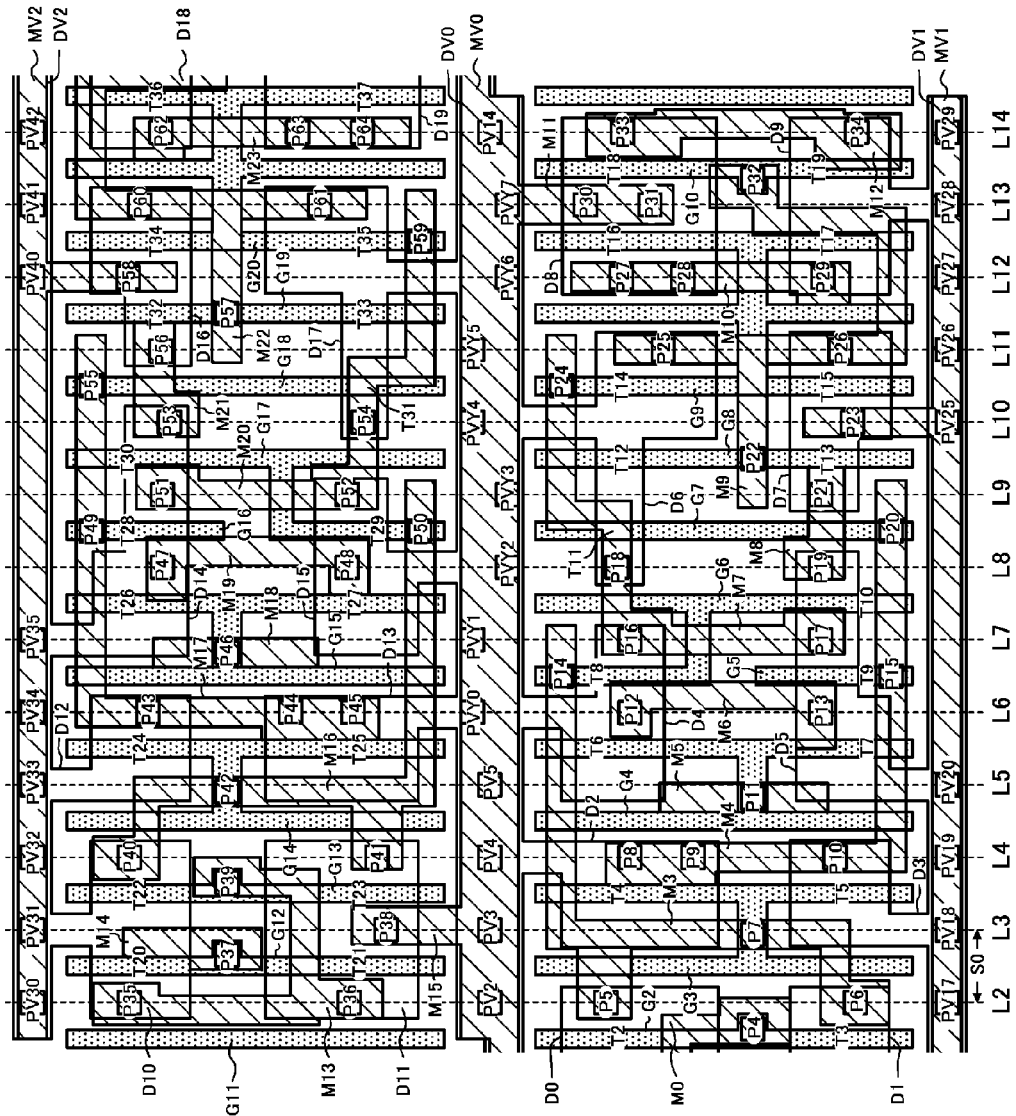
FIG. 7 illustrates another example layout pattern of the semiconductor device according to the second embodiment.

FIG. 7 is a top view illustrating another example layout pattern of the semiconductor device according to the second embodiment. Similar to FIG. 1, FIG. 7 illustrates an area around the boundary of two adjacent standard cells as a major portion of the semiconductor device. FIG. 7 illustrates active regions and gate interconnects forming transistors such as MISFETs, metal interconnects provided thereabove, and plugs electrically coupling the active regions to the metal interconnects.

Similar to FIG. 6, in FIG. 7, power supply plugs PVY0-PVY7 are arranged in positions shifted from the rest of the power supply plugs PVn on some grid lines in the power supply active region DV0 and the power supply metal interconnect MV0. However, the widths of the power supply active region DV0 and the power supply metal interconnect MV0 are equal in the portion provided with the shifted power supply plugs PVY0-PVY7 and in the portion provided with the rest of the power supply plugs PVn.

In FIG. 7, as well, a sufficient number of power supply plugs can be sufficiently spaced apart from the interconnect plugs. This mitigates reduction in the source potential of the transistors while reducing the influence of noise occurring in the power supply active regions or the power supply metal interconnects on the gate interconnects. Note that, in view of the layout area, the structure in FIG. 6 is more preferable. On the other hand, in view of facility in the manufacturing process, the structure in FIG. 7 is more preferable.

Third Embodiment

Figure 8:
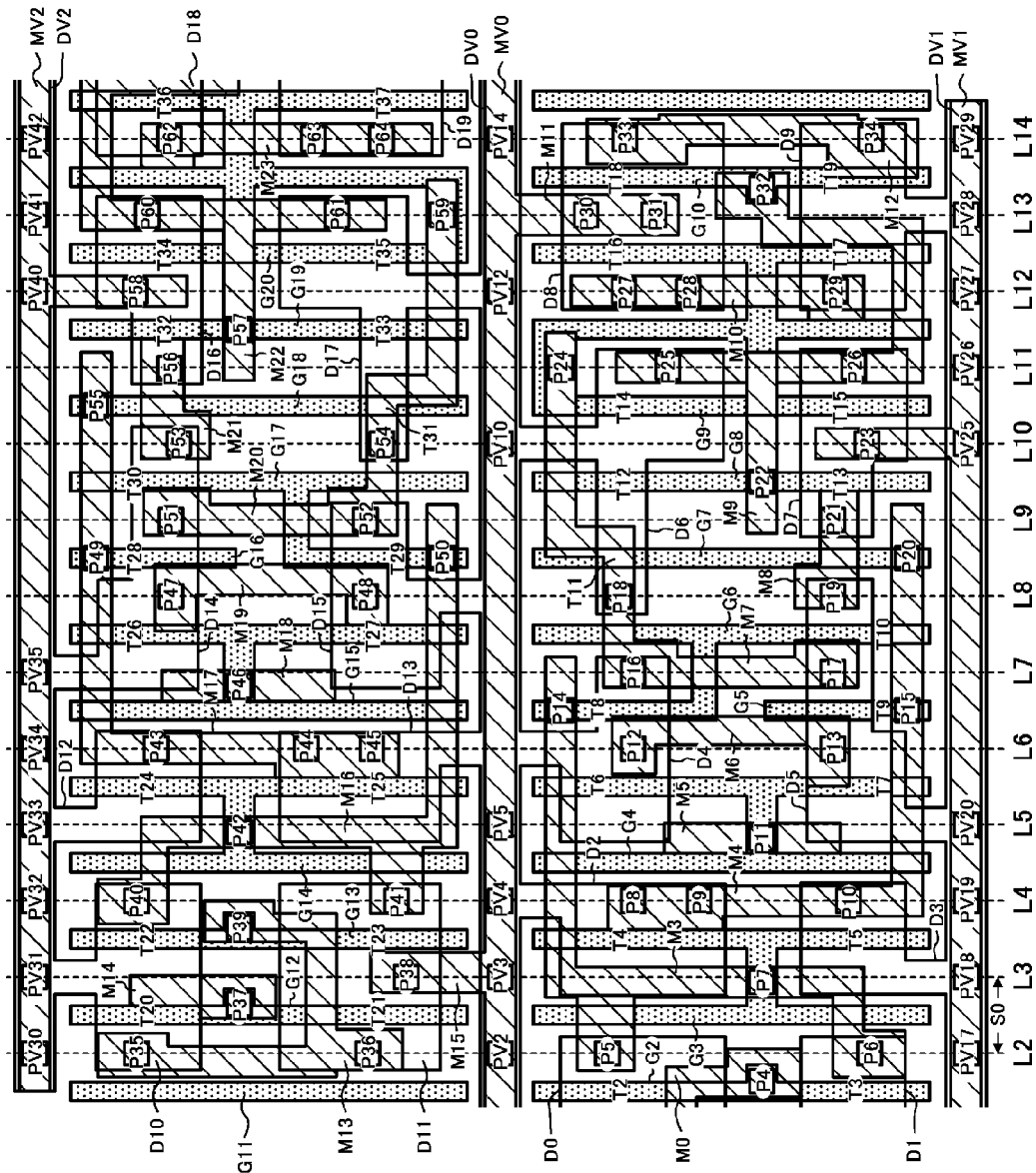
FIG. 8 illustrates an example layout pattern of a semiconductor device according to a third embodiment.

FIG. 8 is a top view illustrating an example layout pattern of a semiconductor device according to a third embodiment. Similar to FIG. 1, FIG. 8 illustrates an area around the boundary of two adjacent standard cells as a major portion of the semiconductor device. FIG. 8 illustrates active regions and gate interconnects forming transistors such as MISFETs, metal interconnects provided thereabove, and plugs electrically coupling the active regions to the metal interconnects. The same reference characters as those shown in FIG. 1 are used to represent equivalent elements, and the explanation thereof will be omitted.

In FIG. 8, the positions of interconnect plugs P24 and P59 are shifted. Specifically, the positions of the interconnect plugs P24 and P59 are shifted to right by a half pitch. As a result, power supply plugs PV10 and PV12 are not omitted but arranged on grid lines L10 and L12. As a result, a sufficient number of power supply plugs can be sufficiently spaced apart from the interconnect plugs. This mitigates reduction in the source potential of the transistors while reducing the influence of noise occurring in the power supply active regions or the power supply metal interconnects on the gate interconnects.

Fourth Embodiment

Figure 9:
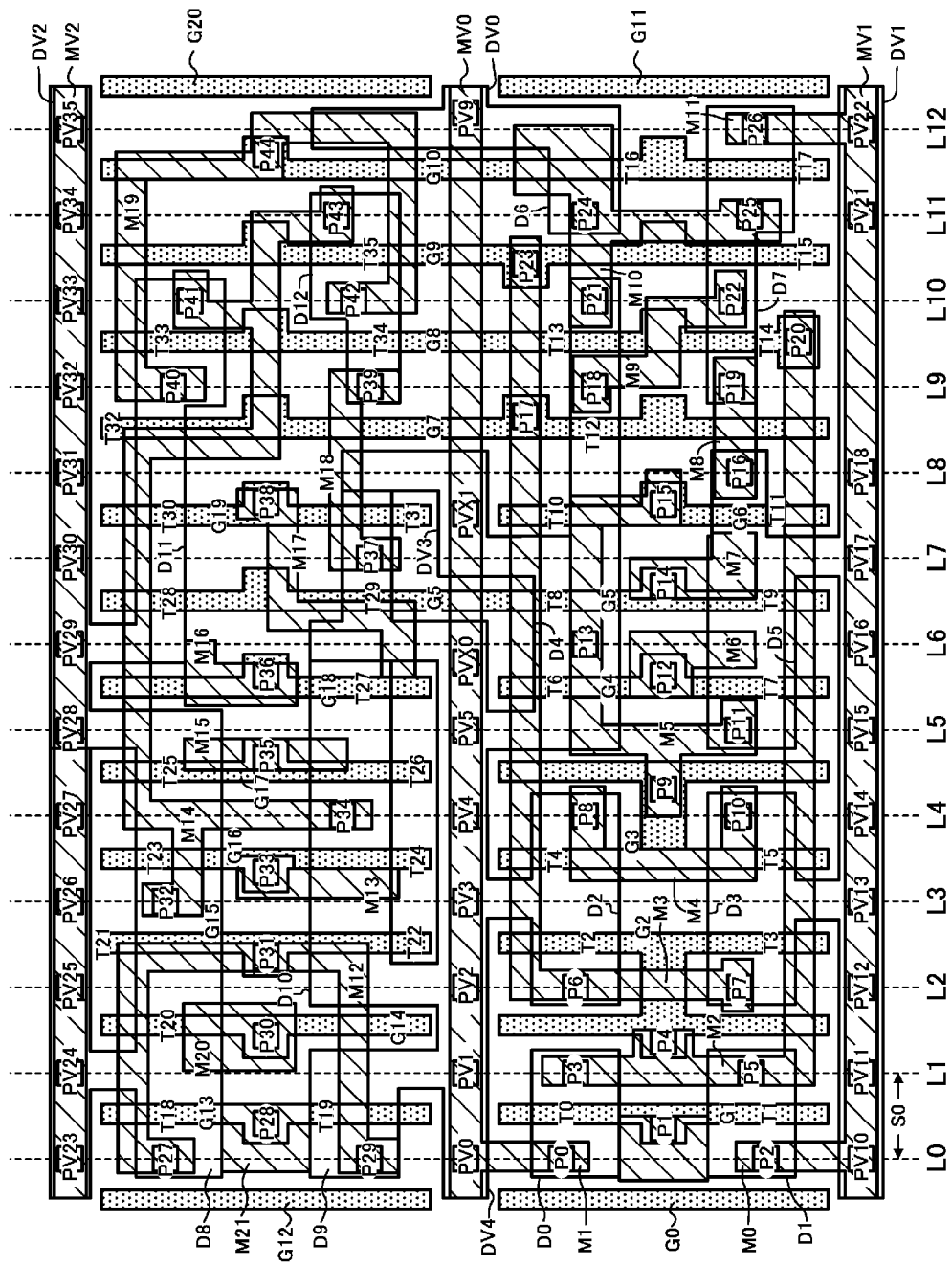
FIG. 9 illustrates an example layout pattern of a semiconductor device according to a fourth embodiment.

FIG. 9 is a top view illustrating an example layout pattern of a semiconductor device according to a fourth embodiment. Similar to FIG. 1, FIG. 9 illustrates active regions and gate interconnects forming transistors such as MISFETs, metal interconnects provided thereabove, and plugs electrically coupling the active regions to the metal interconnects. The same reference characters as those shown in FIG. 1 are used to represent equivalent elements, and the explanation thereof will be omitted.

In FIG. 9, a single standard cell is formed by using two adjacent standard cell rows. Thus, gate interconnects G5, G7, G8, G9, and G10 extend to cross a power supply metal interconnect MV0, which extends in the horizontal direction (a first direction) of the drawing, from side to side in the vertical direction (a second direction) of the drawing. In the layer under the power supply metal interconnect MV0, power supply active regions DV0, DV3, and DV4 are provided to overlap the power supply metal interconnect MV0. The power supply active regions DV0, DV3, and DV4 are electrically coupled to the power supply metal interconnect MV0 by a plurality of power supply plugs PV0-PV5, PV9, PVX0, and PVX1, which are formed therebetween.

As described above, power supply plugs electrically coupling power supply active regions to power supply metal interconnects are usually arranged in a plural number and at pitches of a predetermined length to reduce the source potential drop of the transistors. In FIG. 9, power supply plugs PVn, where n is an integer, are basically arranged on grid lines L0-L12, which are spaced apart from each other at constant distances S0. Where the gate interconnects, which cross the power supply metal interconnects, are too close to the power supply plugs, the possibility of causing formation problems such as shorting of the gate interconnects and the power supply plugs increases. Omitting power supply plugs on the grid lines, which are close to the gate interconnect crossing the power supply metal interconnects, is considered as a measure. It is, however, not preferable, since the source potential of the transistors decreases, as described above.

Thus, in this embodiment, the power supply plugs, which are too close to the gate interconnects crossing the power supply metal interconnects, are not completely omitted but are arranged in positions shifted from the grid lines to be more distant from the gate interconnects. For example, the power supply plug PVX0 is shifted from the grid line L6 in the horizontal direction to be more distant from the gate interconnect G5. This power supply plug PVX0 mitigates reduction in the source potential of a transistor T27. Similarly, in order to mitigate reduction in the source potential of transistors T8, T10, and T31, a power supply plug PXV1 is provided in the position shifted from grid lines L7 and L8 in the horizontal direction to be more distant from the gate interconnects G5 and G7. This mitigates reduction in the source potential of the transistors while reducing the influence of formation problems such as shorting of the gate interconnects and the power supply plugs.

In this embodiment, the power supply plugs coupling the power supply active regions DV0, DV3, and DV4 to the power supply metal interconnect MV0, include the plurality of first plugs PV0-PV5, which are arranged at first pitches S0 of a predetermined length, and the second plugs PVX0 and PVX1, which are spaced apart from the closest first plug PV5 by a center-to-center distance different from the integral multiple of the predetermined length. The power supply plug closest to the gate interconnect G5, which crosses the power supply metal interconnect MV0, is the second plug PVX0.

Fifth Embodiment

Figure 10:
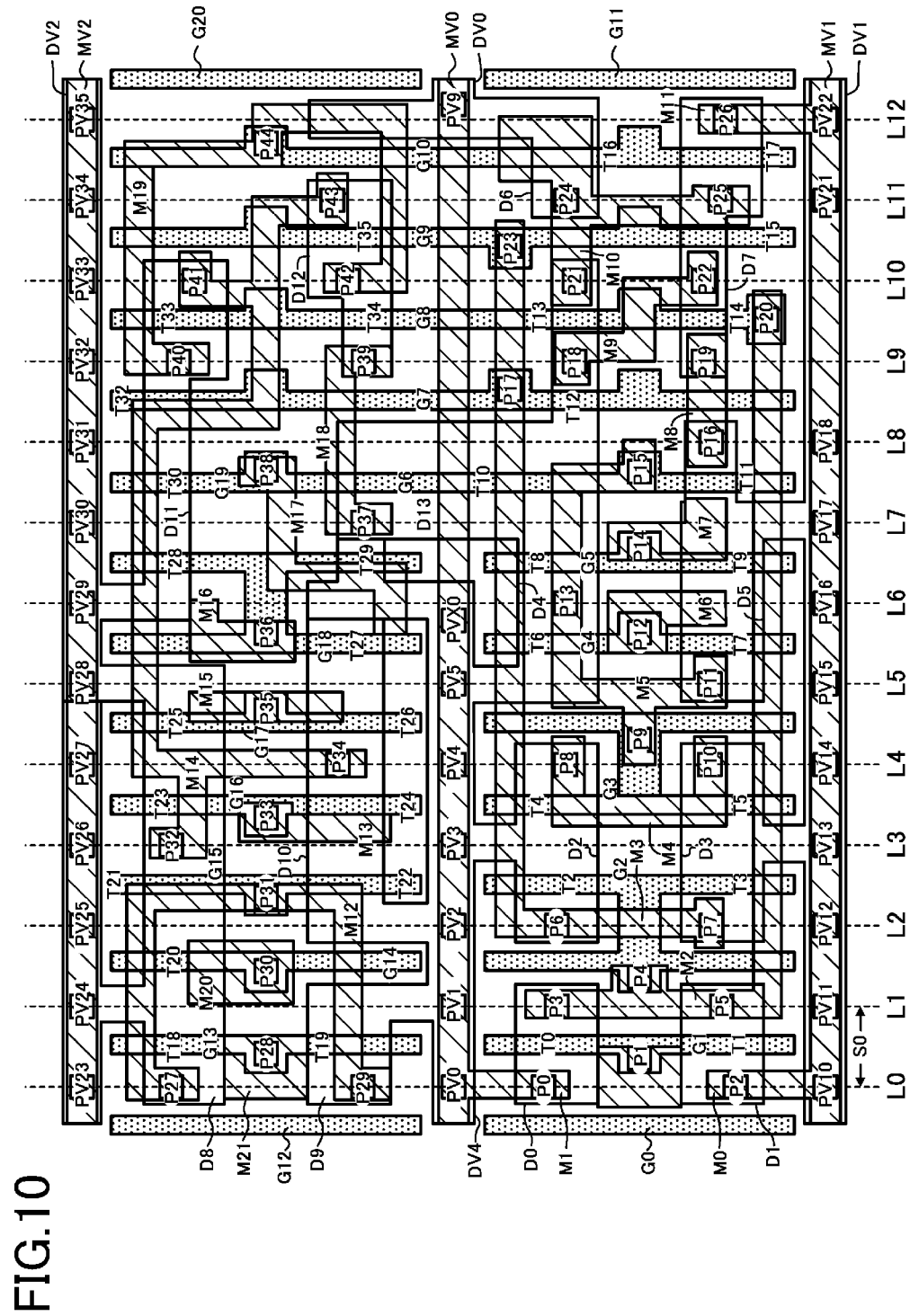
FIG. 10 illustrates an example layout pattern of a semiconductor device according to a fifth embodiment.
Figure 11:
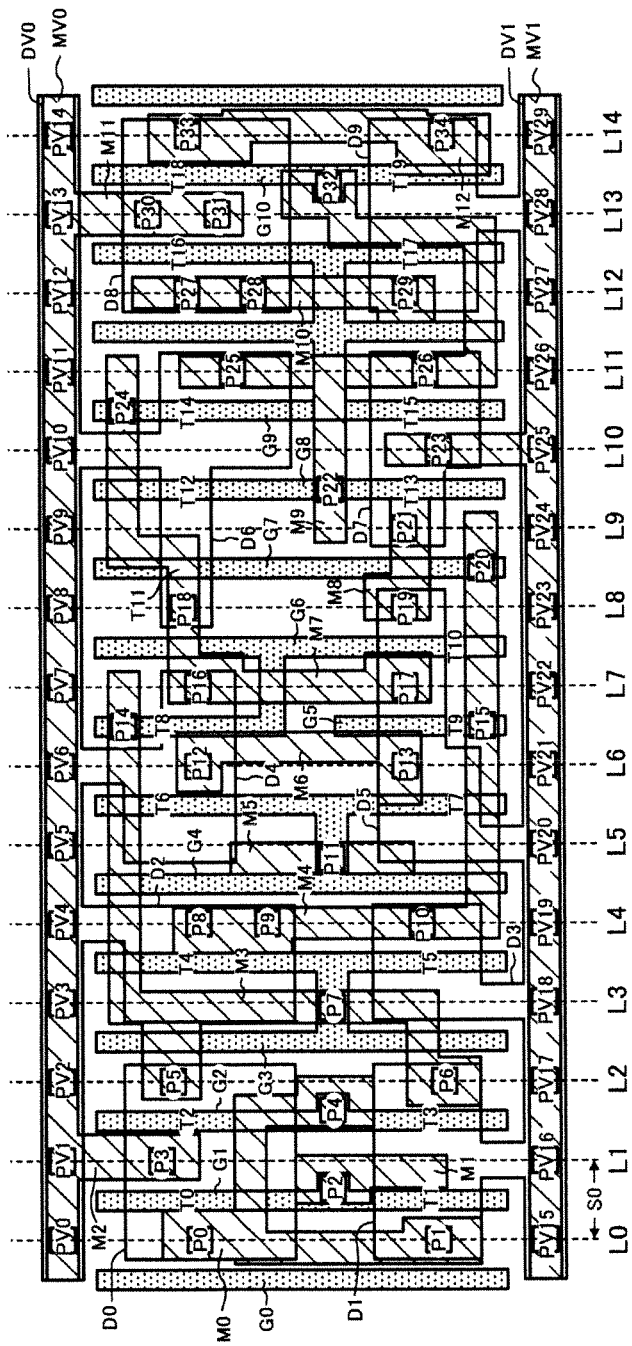
FIG. 11 is a layout top view of a latch circuit cell.
Figure 12:
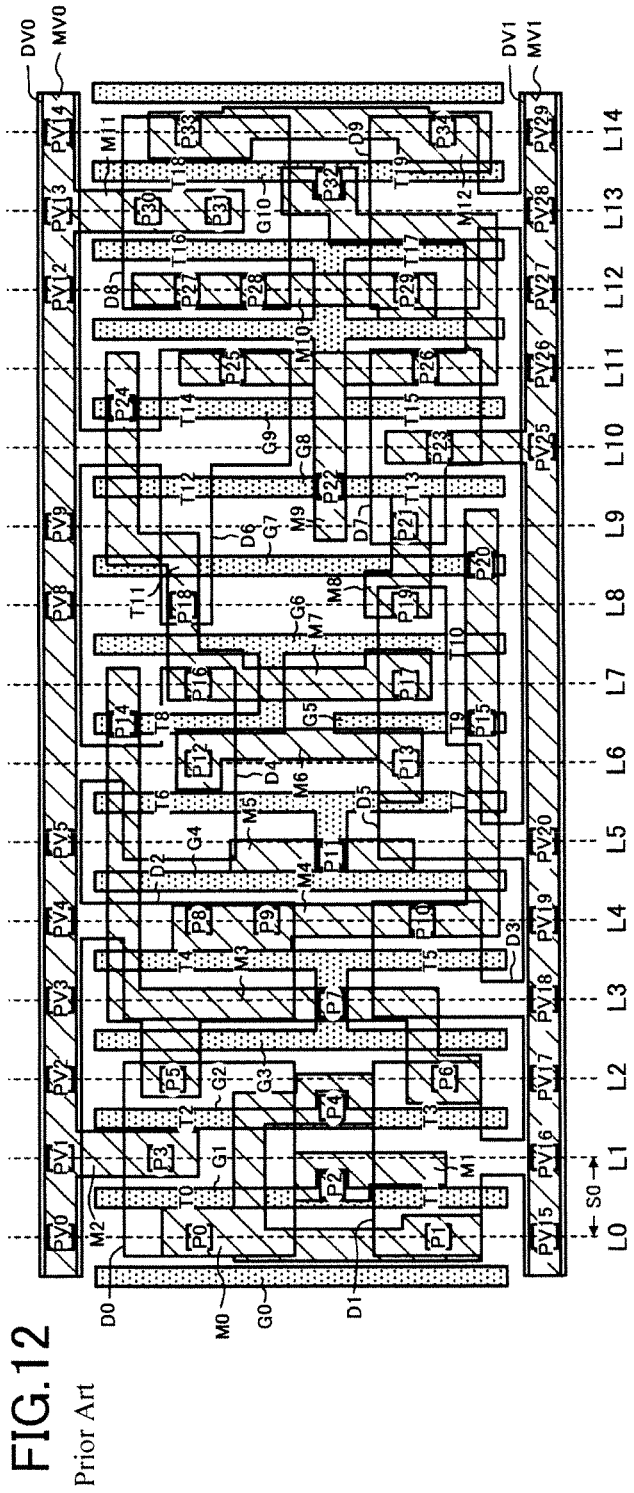
FIG. 12 illustrates an example where a conventional technique is applied to the layout of FIG. 11.
Figure 13:
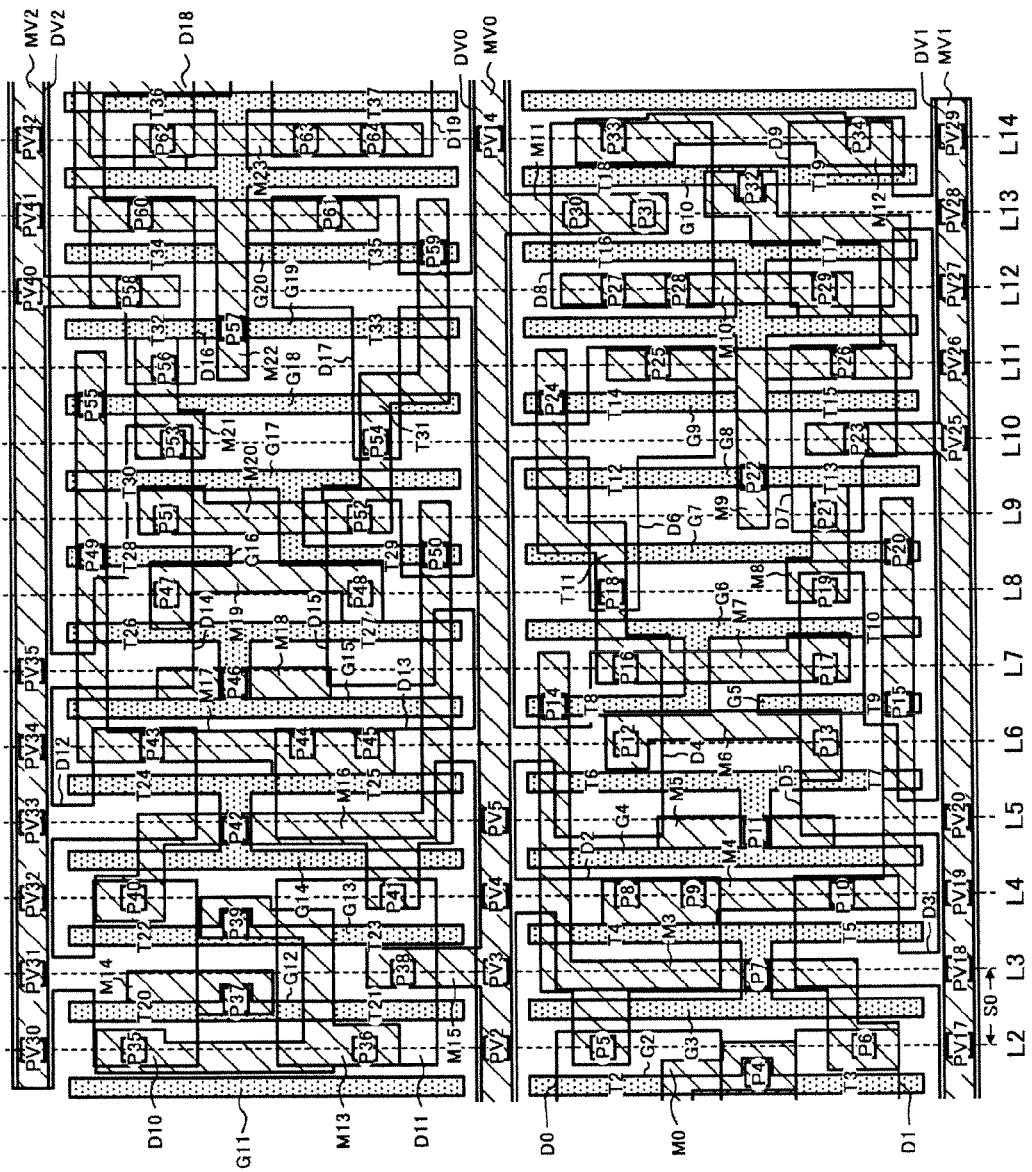
FIG. 13 illustrates an example layout pattern of a conventional semiconductor device.

FIG. 10 is a top view illustrating an example layout pattern of a semiconductor device according to a fifth embodiment. Similar to FIG. 1, FIG. 10 illustrates active regions and gate interconnects forming transistors such as MISFETs, metal interconnects provided thereabove, and plugs electrically coupling the active regions to the metal interconnects. The same reference characters as those shown in FIG. 1 are used to represent equivalent elements, and the explanation thereof will be omitted.

Similar to FIG. 9, in FIG. 10, a single standard cell is formed by using two adjacent standard cell rows. Thus, gate interconnects G6, G7, G8, G9, and G10 extend to cross a power supply metal interconnect MV0, which extends in the horizontal direction (a first direction) of the drawing, from side to side in the vertical direction (a second direction) of the drawing. In addition, an active region D13 extends to cross the power supply metal interconnect MV0 from side to side in the vertical direction of the drawing. The active region D13 forms a transistor together with the gate G6, and receives potential different from the power supply potential supplied by the power supply metal interconnect MV0. Power supply active regions DV0 and DV4 are provided in a layer under the power supply metal interconnect MV0 to overlap the power supply metal interconnect MV0. The power supply active regions DV0 and DV4 are electrically coupled to the power supply metal interconnect MV0 by a plurality of power supply plugs PV0-PV5, PV9, and PVX0, which are formed therebetween.

As described above, power supply plugs electrically coupling power supply active regions to power supply metal interconnects are usually arranged in a plural number and at pitches of a predetermined length to reduce the source potential drop of the transistors. In FIG. 10, power supply plugs PVn, where n is an integer, are basically arranged on grid lines L0-L12, which are spaced apart from each other at constant distances S0. Where the active regions crossing the power supply metal interconnects are too close to the power supply plugs, the possibility of causing formation problems such as shorting of the active regions and the power supply plugs increases. Omitting power supply plugs on the grid lines, which are close to the active regions crossing the power supply metal interconnects, is considered as a measure. It is, however, not preferable, since the source potential of the transistors decreases, as described above.

Thus, in this embodiment, the power supply plugs, which are too close to the active regions crossing the power supply metal interconnects, are not completely omitted but are arranged in positions shifted from the grid lines to be more distant from the active regions. For example, the power supply plug PVX0 is shifted from the grid line L6 in the horizontal direction to be more distant from the active region D13. This power supply plug PVX0 mitigates reduction in the source potential of a transistor T27. As a result, the reduction in the source potential of the transistors can be mitigated while reducing the influence of formation problems such as shorting of the active regions and the power supply plugs.

In this embodiment, the power supply plugs, which couple the power supply active regions DV0 and DV4 to the power supply metal interconnect MV0, include the plurality of first plugs PV0-PV5, which are arranged at first pitches S0 of a predetermined length, and the second plug PVX0, which is spaced apart from the closest first plug PV5 by a center-to-center distance different from the integral multiple of the predetermined length. The power supply plug closest to the active region D13 crossing the power supply metal interconnect MV0 is the second plug PVX0.

While in this embodiment, the active region crossing the power supply metal interconnect forms a transistor together with the gate inter connect crossing the power supply metal interconnect, the present disclosure is not limited thereto. This embodiment is valid as long as an active region, which receives potential different from the power source supply supplied by the power supply metal interconnect, crosses the power supply metal interconnect.

If a plug is for the potential equal to that of the active region crossing the power supply metal interconnect, there is no problem in providing the plug close to the active region. For example, the plug for the source potential of a transistor T10 may be provided between the gate interconnects G6 and G7 to overlap the power supply metal interconnect MV0.

The semiconductor device according to the present disclosure maintains operation stability and a small area of a cell, while mitigating reduction in the speed of the semiconductor device, and is thus applicable to a semiconductor integrated circuit etc. mounted in various electronic devices and having a reduced area.

What is claimed is:

1. A semiconductor device comprising:
   a power supply active region extending in a first direction;
   an active region located at one side of the power supply active region in a second direction perpendicular to the first direction and serving as a source or a drain of a transistor;
   a gate interconnect located at the side of the power supply active region, at which the active region is located, in the second direction, and serving as a gate of the transistor;
   a power supply metal interconnect located above the power supply active region;
   a circuit metal interconnect located above the active region and the gate interconnect;
   a plurality of power supply plugs coupling the power supply active region to the power supply metal interconnect; and
   a plurality of interconnect plugs coupling the active region or the gate interconnect to the circuit metal interconnect, wherein:
   the plurality of power supply plugs include:
      a plurality of first plugs arranged at first pitches of a predetermined length, and
      a second plug spaced apart from closest one of the plurality of first plugs by a center-to-center distance which is different from an integral multiple of the predetermined length,
   the plurality of interconnect plugs include a third plug closest to the power supply active region and the power supply metal interconnect, and
   among the plurality of power supply plugs, the second plug is closest to the third plug.

2. The semiconductor device of claim 1, wherein:
   the second plug includes a plurality of second plugs,
   the third plug includes a plurality of third plugs, and each of the plurality of third plugs is closest to one of the plurality of second plugs among the plurality of power supply plugs.

3. The semiconductor device of claim 1, herein:
the second plug includes a plurality of second plugs,
the third plug includes a plurality of third plugs, and
at least one of the plurality of second plugs is closest to one of the plurality of third plugs among the plurality of interconnect plugs.

4. The semiconductor device of claim 1, wherein:
the second plug includes a plurality of second plugs, and
a center-to-center distance between the plurality of second plugs is the integral multiple of the predetermined length.

5. The semiconductor device of claim 1, wherein
a distance from a center of each of the plurality of interconnect plugs to closest one of the plurality of power supply plugs is preferably greater than 2.5 times a diameter of the plurality of interconnect plugs.

6. The semiconductor device of claim 1, wherein
the second plug has a rectangular or oval shape as viewed in plan.

7. The semiconductor device of claim 1, wherein
the active region, the gate interconnect, and the circuit metal interconnect form a flip-flop circuit or a latch circuit.

8. A semiconductor device comprising:
a first power supply active region and a second power supply active region extending in a first direction;
an active region located between the first and second power supply active regions, and serving as a source or a drain of a transistor;
a gate interconnect located between the first and second power supply active regions, and serving as a gate of the transistor;
a power supply metal interconnect located above the first power supply active region;
a circuit metal interconnect located above the active region and the gate interconnect;
a plurality of power supply plugs coupling the first power supply active region to the power supply metal interconnect; and
a plurality of interconnect plugs coupling the active region or the gate interconnect to the circuit metal interconnect, wherein:
the plurality of power supply plugs include:
a plurality of first plugs arranged at first pitches of a predetermined length; and
a second plug spaced apart from closest one of the plurality of first plugs by a center-to-center distance which is different from an integral multiple of the predetermined length,
the plurality of interconnect plugs include a third plug closest to the first power supply active region and the power supply metal interconnect, and
among the plurality of power supply plugs, the second plug is closest to the third plug.

* * * * *